US006838379B1

(12) United States Patent
Kwak et al.

(10) Patent No.: US 6,838,379 B1
(45) Date of Patent: Jan. 4, 2005

(54) PROCESS FOR REDUCING IMPURITY LEVELS, STRESS, AND RESISTIVITY, AND INCREASING GRAIN SIZE OF COPPER FILLER IN TRENCHES AND VIAS OF INTEGRATED CIRCUIT STRUCTURES TO ENHANCE ELECTRICAL PERFORMANCE OF COPPER FILLER

(75) Inventors: Byung-Sung Kwak, Portland, OR (US); Jayanthi Pallinti, Gresham, OR (US); William Barth, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/676,934

(22) Filed: Sep. 30, 2003

(51) Int. Cl.[7] ............................................. H01L 21/44
(52) U.S. Cl. ...................... 438/672; 438/678; 438/687; 257/E23.161
(58) Field of Search ............................... 438/672, 678, 438/687; 257/E23.161

(56) References Cited

U.S. PATENT DOCUMENTS

| 5,874,367 | A | 2/1999 | Dobson |
| 6,254,758 | B1 * | 7/2001 | Koyama .................... 205/187 |
| 6,391,777 | B1 * | 5/2002 | Chen et al. ................. 438/687 |

OTHER PUBLICATIONS

Bothra, S., et al., "Integration of 0.25 μm Three and Five Level Inter–connect System for High Performance ASIC", *1997 Proceedings Fourteenth International VMIC Conference*, Santa Clara, CA, Jun. 10–12, 1997, pp. 43–48.

Brongersma, S.H., et al., Non–Correlated Behavior of Sheet Resistance and Stress During Self–Annealing of Electroplated Copper, *IITC*, 1999, pp. 290–292.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Dobson, C.D., et al., "Advanced $SiO_2$ Planarization Using Silane and $H_2O_2$", *Semiconductor International*, Dec. 1994, pp. 85–88.

Hau–Riege, Stefan P., Handbook entitled "Copper Interconnect Technology", University of California–Berkeley Extension Course, Apr., 2002, pp. 129–137.

Kittel, Charles, *Introduction to Solid State Physics*, 6th ed., New York: John Wiley & Sons, 1986, pp. 143, 145.

(List continued on next page.)

*Primary Examiner*—George Fourson
*Assistant Examiner*—Thanh V Pham
(74) *Attorney, Agent, or Firm*—John P. Taylor

(57) ABSTRACT

A process for forming copper metal interconnects and copper-filled vias in a dielectric layer on an integrated circuit structure wherein the impurity level of the copper-filled metal lines and copper-filled vias is lowered, resulting in an increase in the average grain size of the copper, a reduction of the resistivity, and more homogeneous distribution of the stresses related to the formation of the copper metal lines and copper-filled vias throughout the deposited copper. The process comprises: depositing a partial layer of copper metal in trenches and via openings previously formed in one or more dielectric layers, then annealing the deposited copper layer at an elevated temperature for a predetermined period of time; and then repeating both the deposit step and the step of annealing the deposited layer of copper one or more additional times until the desired final thickness is reached. After the deposition and annealing of the deposited copper, the annealed structure is then planarized preferably using, for example, a chemical mechanical polishing (CMP) process, and then the planarized structure is again annealed. Preferably the process further includes removing a thin portion of copper from the surface of the deposited and annealed copper layer.

16 Claims, 4 Drawing Sheets

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Pervail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Ramanan, V.R.V., et al., "Crystallization Kinetics in Fe–B–Si Metallic Glasses", *J. Appl. Phys.*, vol. 53, No. 3, Mar., 1982, pp. 2273–2275.

Ritzdorf, T., et al., "Comparative Investigation of Plating Conditions on Self–Annealing of Electrochemically Deposited Copper Films", *IITC*, 1999, pp. 287–289.

Rossnagel, S.M., et al., "From PVD to CVD to ALD for Interconnects and Related Applications", *IITC*, 2001, p. 2.

* cited by examiner

STEP 1

DEPOSIT COPPER INTO PATTERN OF TRENCHES AND VIA OPENINGS PREVIOUSLY FORMED IN SURFACE OF DIELECTRIC LAYER

STEP 2

PLANARIZE UPPER SURFACE OF RESULTING STRUCTURE TO REMOVE ALL COPPER ON UPPER SURFACE OF DIELECTRIC LAYER, LEAVING COPPER REMAINING ONLY IN TRENCHES AND VIAS

STEP 3

ANNEAL COPPER REMAINING IN TRENCHES AND VIAS

FIG._1
*(PRIOR ART)*

|  | ECP Process | MTF | Sigma | T $_{0.1\%}$ at use cond. |
|---|---|---|---|---|
| Met 2 EM | 1-step | 119 | 0.8 | 240 |
|  | 2-step | 70 | 0.4 | 492 |
| Via 1 EM | 1-step | 52 | 0.51 | 51 |
|  | 2-step | 43 | 0.22 | 103 |

FIG._4

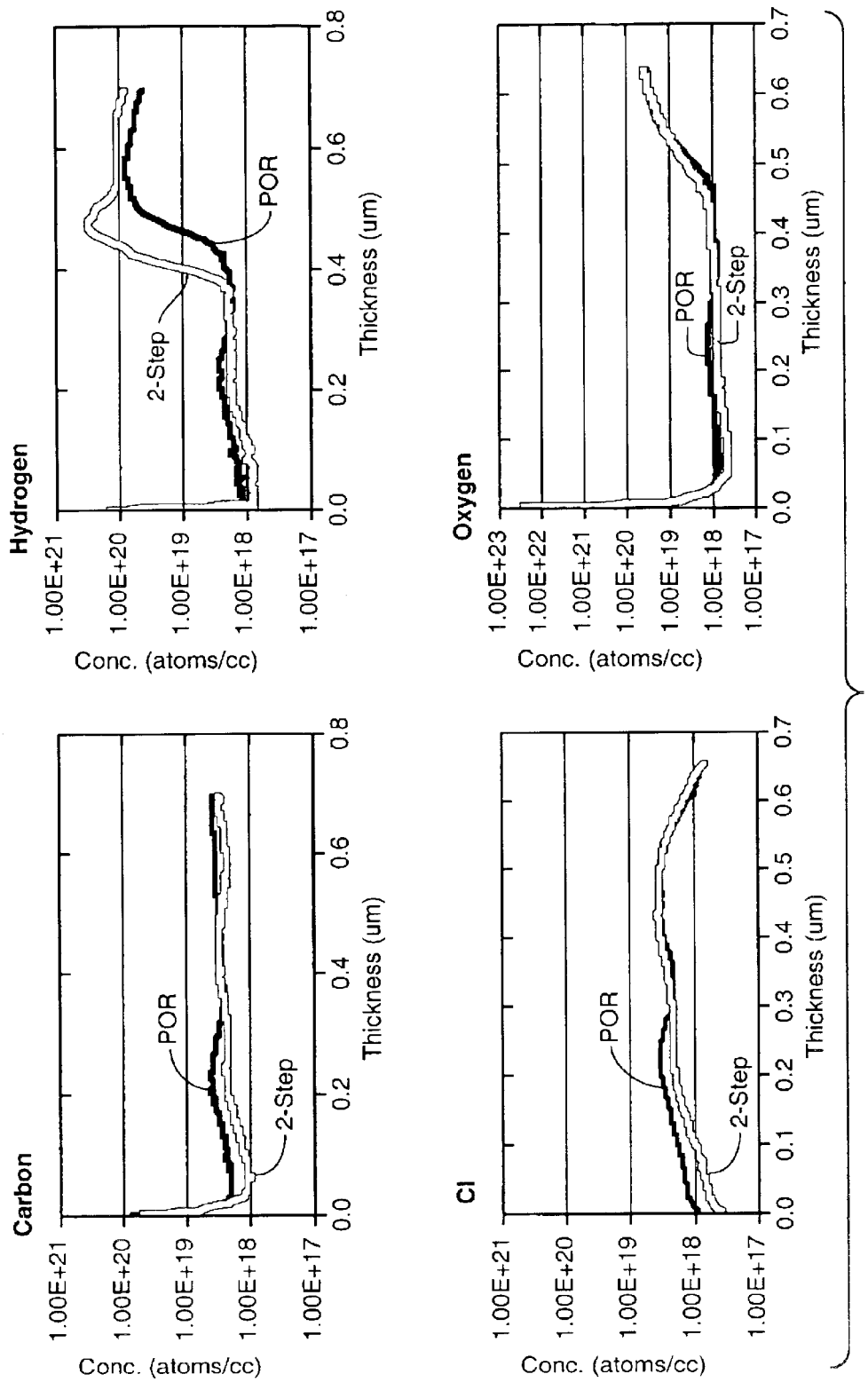
FIG._2

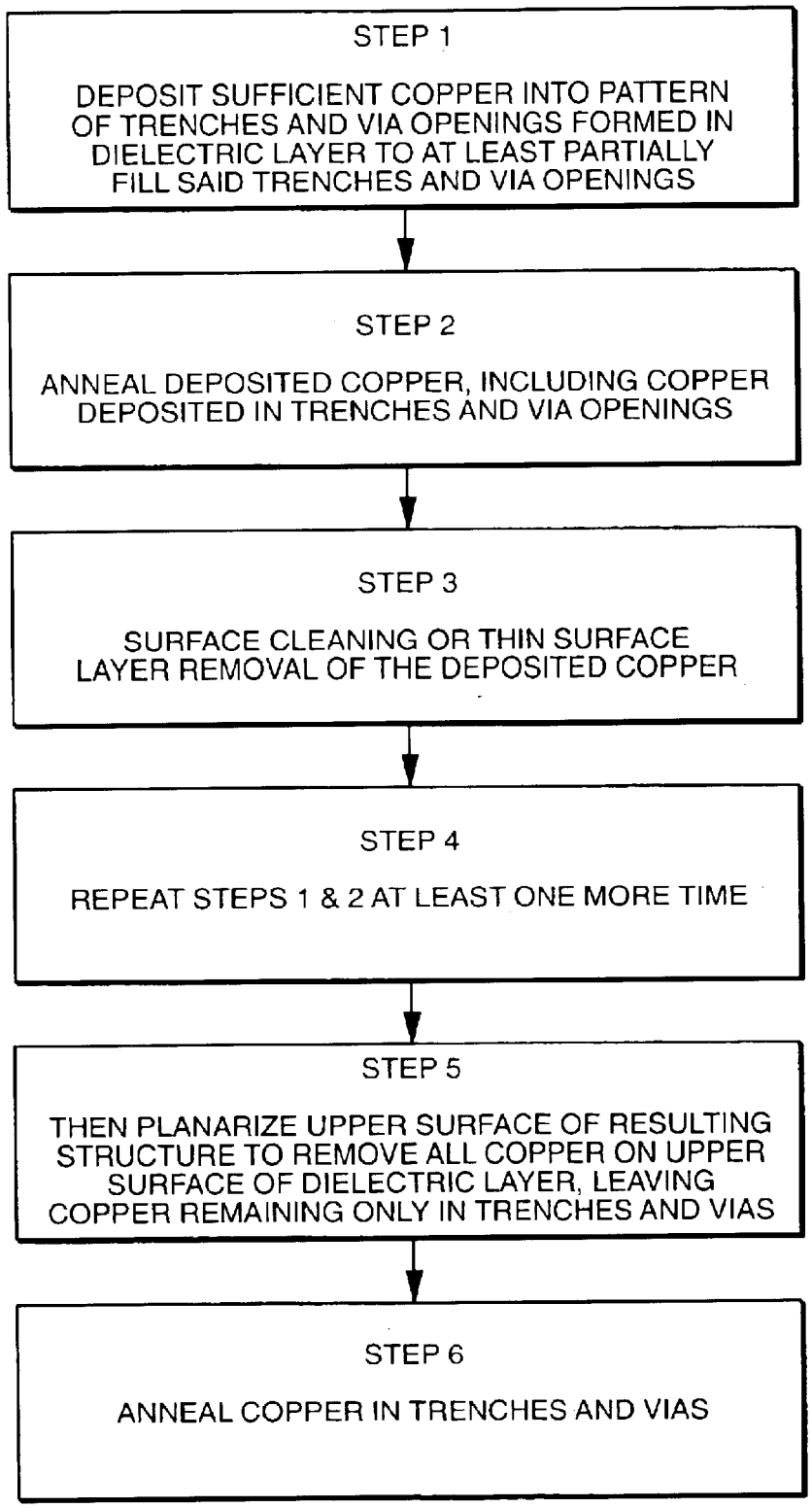
FIG._3

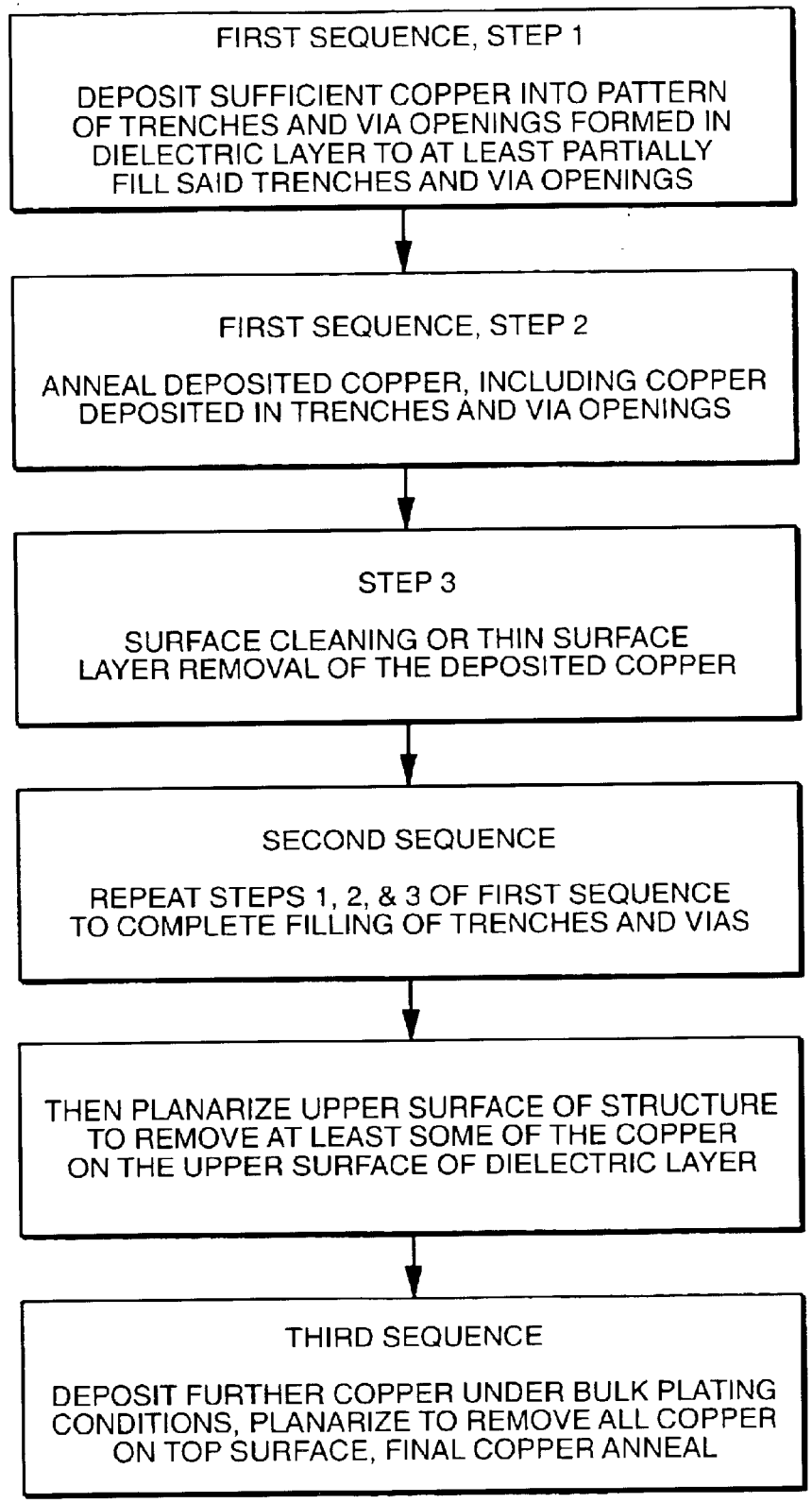
FIG._5

PROCESS FOR REDUCING IMPURITY LEVELS, STRESS, AND RESISTIVITY, AND INCREASING GRAIN SIZE OF COPPER FILLER IN TRENCHES AND VIAS OF INTEGRATED CIRCUIT STRUCTURES TO ENHANCE ELECTRICAL PERFORMANCE OF COPPER FILLER

BACKGROUND OF THE INVENTION

1. Field of the Invention

This invention relates to a process for the filling, with copper, of trench and via openings in a dielectric layer of an integrated circuit structure in a manner which will remove impurities and promote the growth of larger copper grain sizes to thereby lower the resistivity and stress, and enhance electromigration (EM) of the copper metal filler.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon the resistivity of the deposited copper is lowered, Technologies of Newport, Gwent, U.K.

The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The above-mentioned shrinking of integrated circuits and the concurrent ever increasing demands for faster speeds, has also resulted in renewed interest in the use of copper as a filler material for vias and contact openings instead of tungsten, as well as for use in metal lines or interconnects instead of aluminum because of the well known low electrical resistance of copper, compared to either aluminum or tungsten.

However, it has been found that at the dimensions utilized in forming wiring structures using copper in integrated circuit structures, problems arise when attempting to conventionally pattern a layer of copper through a mask in the manner in which aluminum and tungsten wiring structures are formed.

This, in turn, has led to the formation of copper-filled vias and copper metal lines by a different type of construction known as a damascene (when only metal lines or copper-filled vias are to be formed), or a dual damascene construction (when copper metal-filling of vias and metal lines (formed in a second dielectric layer above the via-containing layer), is performed in the same step). In, for example, a single damascene construction, a first or second layer of dielectric material (preferably a low k dielectric material) is initially formed over an integrated circuit structure, and the desired pattern of vias or trenches is etched in the dielectric layer as a series of vertical openings. The filler metal such as copper (as well as other layers of conductive material, such as barrier and adhesion-promoting materials) are then deposited in each type of openings and over the top surface of the dielectric layer. Planarization processes such as a chemical/mechanical polishing (CMP) process are then applied to the upper surfaces of the structure to remove all excess conductive filler material from the upper surface of the dielectric material, leaving a series or pattern of copper-filled vias or trenches. The copper-filled and planarized integrated circuit structure is then subject to anneal. Such a construction is illustrated in the flow sheet of prior art FIG. 1.

In the dual damascene process, a thicker dielectric layer for both vias and trenches is formed over the integrated circuit structure. Subsequently, depending on the integration scheme, the layer is processed to either form the vias first and then form the trenches or, vice versa, the trenches are formed first followed by formation of the vias. Once the vias and trenches are formed, copper filler material is then deposited into both types of features in the same step, once again followed by planarizing back to the dielectric layer using a CMP process.

However, even when the damascene processes are successfully implemented, and filled copper metal lines and vias have been formed, the formation of a high resistivity copper filler material in the trenches and vias may occur. According to Charles Kittel, in Introduction to Solid State Physics, p. 145 (1986), the electrical resistivity of metals consists of two sources of scattering or collisions by the conduction electrons: (1) lattice phonons and (2) impurities and\or imperfections.

Typically, at room temperature, the lattice phonon component dominates, while at liquid Helium temperatures, the impurity/imperfection component does. However, in copper interconnects, the contribution to high resistivity from impurity collisions cannot be neglected and has been estimated by S. M Rossnagel, [IITC 2(2001)], to become increasingly dominant when the gap dimension reaches 0.1 micrometer ($\mu$m) and below.

The elements that contribute to the "impurity" component can be characterized as (1) impurity atoms and molecules (carbon, sulfur, chlorine, etc. incorporated into the copper filler material during the deposition (electroplating) process); (2) lattice imperfections at grain boundaries; and (3) lattice imperfections at the grain-sidewall interfaces. Reduction of these sources will result in improved metal line resistivity.

With respect to the lattice imperfections at grain boundaries and grain-sidewall interfaces, impurities in the copper apparently lead to smaller grain size which, in turn, leads to higher resistivities of the deposited copper. The smaller size grains in the metal lines and contacts (vias), implies that the impurity levels are highest in these metal lines and vias since the impurities are suspected to be the chief hindrance to grain coalescence. These impurities will directly or indirectly contribute to the increase overall resistivity as well. Such increases in resistivity, in turn, can limit the usefulness of copper as a filler material as it counters copper's lower bulk resistivity.

Another impact of the smaller size grains in metal lines and vias (resulting in an increase in grain boundary density and impurity levels) is the potential decrease in electromigration (EM) performance.

A further impact of the smaller and inconsistent grain structures (and sizes) results from the "non-optimal" stress distribution within the metal structures. The stress relaxation process during subsequent processing can result in stress-induced voids, and, therefore, device failures. The grain structures and sizes can also impact the post-planarization (e.g., CMP) deflectivity, which has been linked to reduced EM performance.

Various published experimental data show close relationship between the grain growth and impurity levels. T. Ritzdorf et al. [IITC 287 (1999)] observes slower transformation (self annealing or grain growth/coalescence) with higher level of impurity in electroplating bath, while S. Brongersma et al. [IITC 290 (1999)] reports desorption of volatile chemicals with grain growth transformation (using TOF-SIMS).

Some of the suggestions for this transformation mechanism (in electroplated Cu) are as follows. S. Brongersma et al., suggests that the additives (in electroplating solution and incorporated in Cu film) segregate to grain boundaries and inhibit grain growth, if not removed or desorbed. He also suggests that the untransformed matrix has a dense grain boundary network (therefore, small grains), which provides the diffusion path for impurities and high driving force for grain growth.

In a University of California-Berkeley extension course entitled "Copper Interconnect Technology" (April, 2002), S. P. Hau-Riege described, on pages 129–137, the effect of impurity diffusion on phase transformation with the Johnson-Mehl-Avrami-Kolmogoroff Theory [a phenomenological model for 11 order phase transformation through nucleation and growth], as analogously applied by Ramanan et al. [J. Appl. Phys. 53, 2273 (1982)], and found agreement with Brongersma. The activation energy, for grain growth, was equated with the impurity diffusing through the untransformed matrix.

The grain growth, in copper film, is activated by "impurity-free" interfacial (grain boundary) strain energy and is hampered by impurities, which need grain boundary networks to diffuse. The consequences of grains in trenches and vias is as follows: unless there are "percolating" grain boundary paths, the impurities with trenches and vias will be trapped and remain a hindrance to grain growth, resulting in the high resistivity, lowered EM performance, and non-optimal stress distribution discussed above.

Interfacial strain between two dissimilar non-reacting materials typically results from the differences in lattice structure, lattice parameters, and coefficient of thermal expansion (CTE). The stress-induced voiding will occur when this stress is at a certain critical level (above the activation energy for void nucleation and growth) when the kinetic hindrance is absent. The level of stress would be particularly significant within the metal lines and vias, wherein there are several sources of stress: grain-to-grain growth, grain-to-sidewall, grain-to-subsequent layer, and impurities.

S. Brongersma, et al., [IITC 290 (1999)] reports that the stress was being relieved as the grain growth/coalescence transformation occurred. Therefore, if the impurity levels (the inhibitor to grain growth, within the metal lines and trenches) can be reduced, the grain growth will be promoted to reduce the stress, and thereby reduce the stress-induced voiding during subsequent processing.

Thus the impurity level ties into some key factors that determine the properties of the copper back end of the line (BEOL) performance, including stress distribution, resistivity and post-CMP deflectivity, the electromigration (EM), and the average grain size of the copper metal deposited in the trenches and vias.

SUMMARY OF THE INVENTION

A process is disclosed for forming improved copper metal interconnects and copper-filled vias in a dielectric layer on an integrated circuit structure wherein the impurity level of the copper-filled metal lines and copper-filled vias is lowered, resulting in an increase in the average grain size of the copper, a reduction of the resistivity, and a more homogeneous distribution, throughout the deposited copper, of the stresses related to the formation of the copper metal lines and copper-filled vias. The process comprises: depositing a partial layer of copper metal in trenches and via openings previously formed in one or more dielectric layers; then annealing the deposited copper layer at an elevated temperature for a predetermined period of time; then optionally planarizing the annealed structure, e.g., using a chemical mechanical polishing (CMP) process (to remove at least some of the impurities brought to the surface by the anneal); and then repeating at least the deposit step and the step of annealing the deposited layer of copper one or more additional times until the desired final thickness is achieved. After the deposition and annealing of the deposited copper, the annealed structure is then planarized preferably using a chemical mechanical polishing (CMP) process, and then the planarized structure is again annealed. In a preferred embodiment, a thin portion of the deposited copper on the upper surface of the copper layer is removed after the final annealing step.

BRIEF DESCRIPTION OF THE DRAWINGS

FIG. 1 is a flowsheet illustrating the prior art process for forming copper metal lines in a dielectric layer of an integrated circuit structure.

FIG. 2 comprises SIMS depth profiling data showing lower carbon, hydrogen, chlorine, and possibly oxygen levels in Cu films deposited using 2-step process.

FIG. 3 is a flowsheet illustrating a two step or sequence embodiment of the process of the invention.

FIG. 4 comprises electro-migration data showing improved process stability (sigma) and improved "at use condition" lifetime.

FIG. 5 is a flow sheet showing a modification of the process shown in the flowsheet to add an additional deposition step and an additional annealing step.

DETAILED DESCRIPTION OF THE INVENTION

The invention comprises a process which results in the formation of improved copper metal interconnects and copper-filled vias in a dielectric layer on an integrated circuit structure wherein the impurity level of the copper-filled metal lines and filled vias is reduced to thereby lower the resistivity, increase the average grain size of the deposited copper, and distribute the stresses more homogeneously throughout the deposited copper.

The process comprises depositing a partial layer of copper metal in trenches and via openings previously formed in a dielectric layer, then annealing the deposited copper layer at an elevated temperature for a predetermined period of time, then optionally planarizing the annealed structure, e.g., using a chemical mechanical polishing (CMP) process (to remove at least some of the impurities brought to the surface by the anneal), then repeating at least the deposit step and the step of annealing the deposited layer of copper one or more additional times until the desired thickness is reached, then again planarizing the annealed structure, preferably using a CMP process, and then annealing the planarized structure.

The use of the term "partial layer" herein, with respect to a particular deposition of copper, is intended to distinguish that particular copper deposition from the total thickness of the multiple depositions of copper to form thereby the desired thickness of the final copper layer. That is, the final copper layer is a composite of the total number of partial layers of deposited copper.

The process of the invention seeks to modulate and control the impurity levels within the vias and trenches since these are deemed to be the key components of the integrated circuit structures, and they (the impurity levels), in turn, affect the resistivity, grain growth, and strain distribution.

While we do not wish to be bound by any particular theories of operation, it appears that as the thick and/or gapfill films coalesce, the impurities in the copper in the trenches and vias are losing their percolation diffusion paths through the coalescing copper, leaving such impurities trapped in the trenches and vias. This implies that an additional factor which must be addressed is the maintenance and preservation of the percolated diffusion paths through the already deposited copper in the trenches and vias.

In accordance with the process of the invention, such paths are preserved in the already-deposited copper by dividing into two or more sequences, the traditional (prior art) single step or sequence of deposition (plating) followed by annealing. Thus, in accordance with the invention, a thin layer of copper is first formed over the insulation layer to partially fill the trenches and vias, and this layer is then annealed. That deposition/anneal sequence is then repeated at least one additional time to complete the filling of the trenches and via openings with annealed copper, following which the structure is subject to a conventional planarization step such as, for example, a chemical mechanical polishing (CMP) process to remove excess copper on the upper surface of the dielectric layer in which the trenches and vias are formed. After the planarization step is carried out, and all copper has been removed from the now planarized upper surface of the dielectric material, the structure is again annealed before passing the integrated circuit structures on to further back end processing. The flow sheet of FIG. 3 illustrates the just-described process when two deposition/anneal sequences are used, while the flowsheet of FIG. 5 illustrate the modified process when three deposition/anneal sequences are used.

While it is not mandatory that a planarization step be carried out after each anneal step, such an optional planarization step after each anneal step will result in the removal of further impurities which diffuse to the top surface of the copper after each anneal step. Such top surface removal could be carried out by any one of a number of planarization methods, including, by way of example, wet etch or chemical mechanical polishing (CMP). Typically from about 50 Å to about 100 Å of the top of the annealed copper layer would be removed during such a planarization step.

It should be noted that when, in accordance with the invention, the deposition and anneal sequence is divided into two or more sequences, the deposition and annealing parameters of the first sequence (or sequences) may be altered or tuned to optimize carrying out a gapfill deposition process, while the later deposition and anneal sequence(s) may be carried out under conditions favoring bulk or surface deposition of copper.

Deposition Conditions

When two deposition/annealing sequences are used, the deposition portion of the first step of the sequence should be carried out for a period of time, during the first deposition step, sufficient to deposit at most about 30% (typically about 20%) of the total thickness of the copper to be deposited in the process, and at least 10% of the total thickness of the copper to be deposited in the two step process. That is, the respective thicknesses of the two copper deposition steps will range between 10% minimum copper deposition thickness in the first step with the balance of 90% copper deposition thickness in the second deposition step (10%–90%); and 30% maximum copper deposition in the first step with the balance of 70% deposited in the second deposition step (30%–70%).

When three deposition/annealing sequences are used, the deposition portion of the first two steps of the sequence should each be carried out for a period of time sufficient to deposit at most about 30%, typically about 20%, of the total thickness of the copper to be deposited in the process, and at least 10%, at each of the first two deposition steps, of the total thickness of copper to be deposited. That is, the respective thicknesses of the first two deposited layers (partial layers) of a three step copper deposition steps will range between 10% minimum copper deposition thickness in each of first two steps with the balance of 80% copper deposition thickness in the third deposition step (10%-10%-80%); and 30% maximum copper deposition in each of first two steps, with the balance of 40% in deposited in the third deposition step (30%-30%-40%).

When four deposition/annealing sequences are used, the sum of the total deposition portions of the first three steps of the sequence should be carried out for a period of time sufficient to deposit at most about 60%, typically about 40%, of the total thickness of the copper to be deposited in the process, e.g., 20%-20%-20%-40%. The minimum deposition amount in each of the first three depositions of partial copper layers in a four deposition process should each be about 10% of the total deposition, with the balance deposited in the fourth deposition process step, e.g., 10%-10%-10%-70%.

After each sub deposition and annealing steps, except the final deposition, a surface cleaning or removal step may be necessary to remove the impurities in the top several nanometers of Cu films and surface contaminants rising to the surface of the deposited copper as a result of the multiple anneals. This can be done using either the standard etching chemicals in the plating tool or a short CMP step.

In any case, (two step, three step, or four step copper deposition processes) the total thickness of all of the copper layers (partial layers) deposited should range from about 1.2 to 2 times the depth of the trench (or via) being filled by the depositions.

Annealing Conditions

As stated earlier, the post-plating anneal step in each sequence can be tailored to achieve specific objectives for that particular sequence. For the anneal or anneals (when more than two sequences are used) after the flowfill deposition(s), the objective is to control the in-film impurity levels within the trenches or vias. Therefore, the temperature and duration of the anneal can be fine tuned to maximize diffusion of the impurity out of the gaps, i.e., to maximize the duration of maintaining the percolated diffusion paths along the grain boundaries.

The annealing step in each sequence should be carried out in an inert or non-reactive atmosphere such as, for example, forming gas comprising 4 volume % $H_2$ in $N_2$. The overall annealing temperature used in each of the deposition/anneal sequences will range from at least about 150° C. to not higher than about 400° C., with a preferred annealing temperature subrange of from about 200° C. up to about 300° C. within this overall annealing temperature range favored for bulk plating.

The annealing may be carried out in a matter of seconds, using rapid thermal annealing (RTA) technology, or the anneal may be carried out in an annealing furnace for a selected period of time such as, for example, about 30 minutes. The exact annealing times for either furnace annealing or using rapid thermal annealing technology may be determined and optimized empirically for each particular integrated circuit structure on which the process of the invention is used.

As stated above, the minimum number of deposition/anneal sequences used, in the process of the invention, is at least two. While there is no limit on the maximum number of deposit/anneal sequences which may be carried out, several other factors must also be taken into account. First of all, since each sequence includes an anneal, the overall thermal budget of the particular integrated circuit structure must be taken into account. Secondly, from a practical point of view, the cost to benefit ratio of the process will probably dictate the maximum number of deposition/anneal sequences utilized. With these factors in mind, the total number of such deposit/anneal sequences will probably not exceed four, and typically will not exceed three.

It should be noted that another reason or advantage for annealing the copper film after only the gapfill portion of the first sequence (or first and second sequences when there are more than two sequences) is that the deposited film thickness above the trenches and vias is relatively thinner. The advantage comes from the fact that the thinner films are harder to anneal, i.e., forced to coalesce, because the thinner films contain less strain energy that can contribute to overcome the activation energy of the grain coalesce. Therefore, the percolated diffusion paths can be maintained longer in thinner films to allow diffusion of the impurities to promote greater within-gap grain growth and strain relaxation.

To further illustrate the process of the invention, a number of samples were prepared. The first set of samples were prepared on blanket silicon wafers, respectively using the prior art (step 1 of FIG. 1) and the claimed process (steps 1, 2, and 4 of FIG. 3) to compare the impurity levels in the copper film at the end of the respective processes, which will indicate the effectiveness of the process in removing or reducing of the impurities. Each of the two sets of wafers were then analyzed, using argon sputtering and a SIMS technique, to determine the depth profile of the various elements, i.e., to determine the impurity levels of carbon, hydrogen, chlorine, and oxygen in the copper filler material. The results are depicted in the graphs of FIG. 2. It is noted that the impurity levels in the two-step process film of the invention exhibits lower impurity levels in all four elements.

To illustrate the process for obtaining the EM data shown in FIG. 4, test wafers were processed with single damascene trench processing (for the first metal layer) followed by dual damascene via and trench processing (for the second metal layer). At each layer, the desired low k dielectric films of appropriate thickness were conventionally deposited, patterned, and etched. Thereafter, the samples were processed through copper wiring processes-barrier, seed, and plating. At the plating step, some of the samples were completely filled with a single deposition of copper filler material in accordance with the prior art, for both the first and second metal layers. Other samples were subject to a two step deposition of copper filler material (both single and dual damascene layers) wherein about 90 nm of copper filler material was first deposited, and the structure was then subject to a first RTA anneal at 235° C., and the remainder of the targeted thickness was plated followed by another RTA anneal at 235° C. All of the wafers were then planarized using a CMP process. All of the now planarized wafers were then subject to a final anneal at 300° C. for 30 minutes. All wafers were then processed through additional standard layers that are required to perform meaningful EM data acquisition, and were packaged for EM testing, e.g., passivation, aluminum pad deposition, etc.

The electromagnetic (EM) test data for single step (prior art) and two step (process of the invention) depositions, for both filled vias and metal lines, is shown in FIG. 4. Although the MTF is slightly higher for a single step process, the test data shows improved process stability (sigma) and lifetime (at use conditions) for the dual step process over the samples subject to the single step processing of the prior art. The two-step process of the invention, which resulted in lower impurity levels (from FIG. 2), seem to show better EM.

The examples above, processed without the preferred embodiment (i.e., without removal of the top surface after each sub-step), suggest that the films processed with the preferred embodiment may result in further improvement, as the removal of the top layer will keep the already removed impurities (diffused out from the Cu filler material in the annealing portion of the first step) from being trapped by subsequent deposition steps.

Having thus described the invention, what is claimed is:

1. A process for forming copper metal interconnects and copper-filled vias in a dielectric layer on an integrated circuit structure wherein the impurity level of the copper-filled metal lines and copper-filled vias is lowered, the process comprising:
    a) depositing a layer of copper metal in trenches and via openings previously formed in one or more dielectric layers;
    b) then annealing the deposited copper layer;
    c) then optionally removing a thin portion of the top surface of the deposited copper layer;
    d) then repeating at least the deposit step and the step of annealing the deposited layer of copper one or more additional times; and
    e) then planarizing the annealed structure.

2. The process of claim 1 including the further step of annealing the planarized structure.

3. The process of claim 2 wherein said copper layer is annealed at a temperature within a range of from about 150° C. to about 400° C.

4. The process of claim 3 wherein said copper layer is annealed in a furnace for a period of from about 0.5 minutes to about 30 minutes.

5. The process of claim 3 wherein said copper layer is annealed using rapid thermal annealing.

6. A process for forming copper metal interconnects and copper-filled vias in a dielectric layer on an integrated circuit structure wherein the impurity level of the copper-filled metal lines and copper-filled vias is lowered, the process comprising:
   a) depositing a layer of copper metal in trenches and via openings previously formed in one or more dielectric layers;
   b) then annealing the deposited copper layer;
   c) then removing a thin portion of the surface of said deposited copper layer;
   d) then repeating the depositing step, the annealing step, and the removing step one additional time; and
   e) then planarizing the annealed structure;
whereby the average grain size of the copper is increased, the resistivity is reduced, and stresses are more homogeneously distributed in the copper.

7. The process of claim 6 including the further step of annealing the planarized structure.

8. The process of claim 7 wherein said copper layer is annealed at a temperature within a range of from about 150° C. to about 400° C.

9. The process of claim 8 wherein said copper layer is annealed in a furnace for a period of from about 0.5 minutes to about 30 minutes.

10. The process of claim 8 wherein said copper layer is annealed using rapid thermal annealing.

11. A process for forming copper metal interconnects and copper-filled vias in a dielectric layer on an integrated circuit structure wherein the impurity level of the copper-filled metal lines and copper-filled vias is lowered, the process comprising:
   a) depositing a layer of copper metal in trenches and via openings previously formed in one or more dielectric layers;
   b) then annealing the deposited copper layer;
   c) then, removing a thin portion of copper from the surface of said deposited copper layer;
   d) then repeating steps a, b, and c one or more additional times to complete the filling of the trenches and vias with copper; and
   e) then planarizing the structure.

12. The process of claim 11 including the further step of annealing the planarized structure.

13. The process of claim 11 including the further steps of:
   a) depositing a further layer of copper metal over said filled trenches and via openings previously formed in said one or more dielectric layers; and
   b) then annealing said further layer of copper.

14. The process of claim 13 wherein said further layer of copper is annealed at a temperature within a range of from about 150° C. to about 400° C.

15. The process of claim 14 wherein said further layer of copper is annealed in a furnace for a period of from about 0.5 minutes to about 5 minutes.

16. The process of claim 14 wherein said further layer of deposited copper is annealed using rapid thermal annealing.

* * * * *